(12) United States Patent
Yokozeki (10) Patent No.: US 6,411,559 B1
(45) Date of Patent: Jun. 25, 2002

(54) SEMICONDUCTOR MEMORY DEVICE INCLUDING A SENSE AMPLIFIER

(75) Inventor: Wataru Yokozeki, Kawasaki (JP)

(73) Assignee: Fujitsu Limited, Kanagawa (JP)

( * ) Notice: Subject to any disclaimer, the term of this patent is extended or adjusted under 35 U.S.C. 154(b) by 0 days.

(21) Appl. No.: 09/671,648

(22) Filed: Sep. 28, 2000

(30) Foreign Application Priority Data

Nov. 29, 1999 (JP) .......................................... 11-338712

(51) Int. Cl.[7] ................................................ G11C 7/00
(52) U.S. Cl. ........................ 365/205; 365/208; 327/55; 327/57
(58) Field of Search ................................ 365/205, 207, 365/208; 327/52, 54, 55, 57

(56) References Cited

U.S. PATENT DOCUMENTS

| | | | |
|---|---|---|---|
| 5,162,681 A | * 11/1992 | Lee | 327/53 |
| 5,525,919 A | * 6/1996 | Phelan | 327/52 |
| 5,534,800 A | * 7/1996 | Hiraki et al. | 327/57 |
| 5,627,789 A | * 5/1997 | Kalb, Jr. | 365/205 |
| 5,982,689 A | * 11/1999 | Takahashi | 365/205 |
| 5,982,692 A | * 11/1999 | Lattimore et al. | 365/208 |
| 2001/0043089 A1 | * 11/2001 | Forbes et al. | 327/67 |
| 2002/0000859 A1 | * 1/2002 | Dai et al. | 327/211 |

FOREIGN PATENT DOCUMENTS

| | | |
|---|---|---|
| JP | 2-230694 | 9/1990 |
| JP | 7-73680 | 3/1995 |

* cited by examiner

*Primary Examiner*—Son Mai
(74) *Attorney, Agent, or Firm*—Arent Fox Kintner Plotkin & Kahn, PLLC (57) ABSTRACT

A semiconductor memory device which comprises a memory cell array having a plurality of memory cells, complementary data bus lines connected to said memory cells in said memory cell array and a sense amplifier. The sense amplifier is connected to the memory cells through the complementary data bus lines and amplifies a difference between current values on said complementary data bus lines associated with a logical value stored in the memory cell. The sense amplifier has a positive feedback circuit having a plurality of differential pairs constructed by transistors.

13 Claims, 12 Drawing Sheets

SEMICONDUCTOR MEMORY DEVICE INCLUDING A SENSE AMPLIFIER

BACKGROUND OF THE INVENTION

1. Field of the Invention

The present invention generally relates to a semiconductor memory device, and more particularly to a current sense amplifier which amplifies a difference current signal between current signals on complementary data lines in a static random access memory (SRAM) to detect a logical value stored in a memory cell.

2. Description of the Related Art

Recently, in the field of semiconductor memories, demands for high integration of memory cells and for reduction of an operation voltage are increasing. However, the reduction of the operation voltage results in reduction of an operation speed for reading data stored in a memory cell and further, a noise margin to correctly decide the data is also reduced. Therefore, it is important to use a sense amplifier which detects the logical value as a difference between current values on the data lines or voltage values on the data lines.

Figure 1:
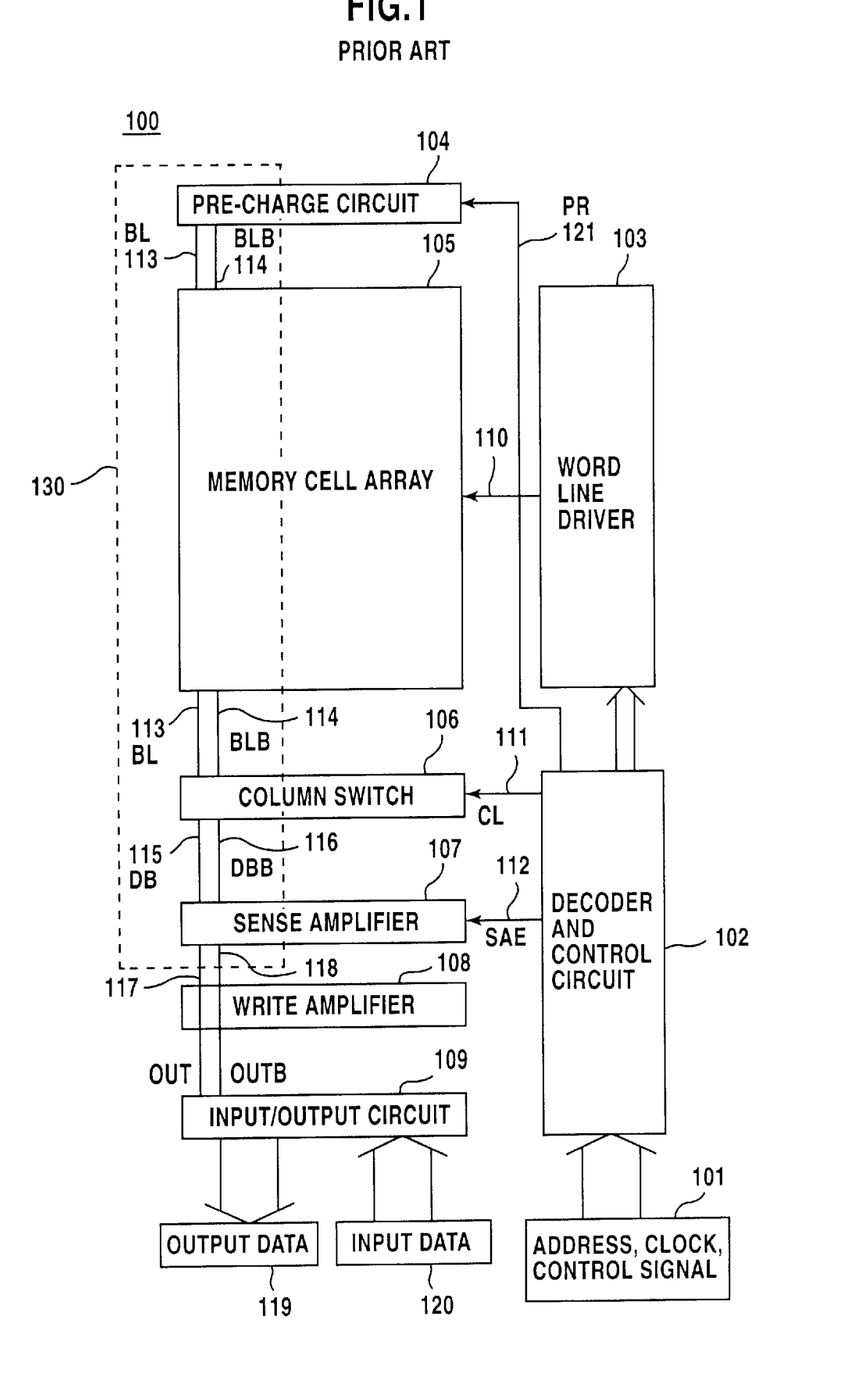
FIG. 1 shows a block diagram of a static random access memory (SRAM)

FIG. 1 shows a block diagram of a static random access memory (SRAM). SRAM 100 mainly has a decoder and a control circuit 102, a word line driver 103, a pre-charge circuit 104, a memory cell array 105, a column switch 106, a sense amplifier 107, a write amplifier 108 and an input/output circuit 109. An area surrounded by a broken line 130 corresponds to a part for one column.

First, a read operation to read data from a memory cell in the SRAM 100 will be explained. In order to read a logical value from the memory cell in the memory cell array 105, first, an address, a clock signal and a control signal 101 is supplied to the decoder and the control circuit 102. The decoder and the control circuit 102 supplies an output signal to the word line driver 103 and also supplies a column selection signal 111 to the column switch 106. Next, a pre-charge signal 121 is supplied to the pre-charge circuit 104 by the decoder and the control circuit 102, then a bit line 113 and an inverted bit line 114 are pre-charged. Then, a word selection signal is supplied to the memory cell array 105 through a word selection line 110, then the memory cell in the memory cell array 105 is activated. The logical value stored in the memory cell is supplied to the bit line 113 and the inverted bit line 114. Next, a sense amplifier enable signal 112 is supplied to the sense amplifier 107 from the decoder and the control circuit 102 so that the sense amplifier 107 is activated. The logical values output on the bit line 113 and the inverted bit line 114 are fed to the sense amplifier 107 through the column switch 106 and are amplified by the sense amplifier 107. The logical value amplified by the sense amplifier 107 is output from the SRAM 100 through the input/output circuit 109 as the output data.

Next, a write operation to write data to the memory cell in the SRAM 100 will be explained. First, input data 120 is supplied to the input/output circuit 109 and is amplified by the write amplifier 108. The input data 120 amplified by the write amplifier 108 is supplied to the memory cell array 105 through the column switch 106. Simultaneously, the address, the clock signal and the control signal 101 is supplied to the decoder and the control circuit 102 as described in the read operation and the input data 120 is written to the memory cell selected by the address.

Figure 2:
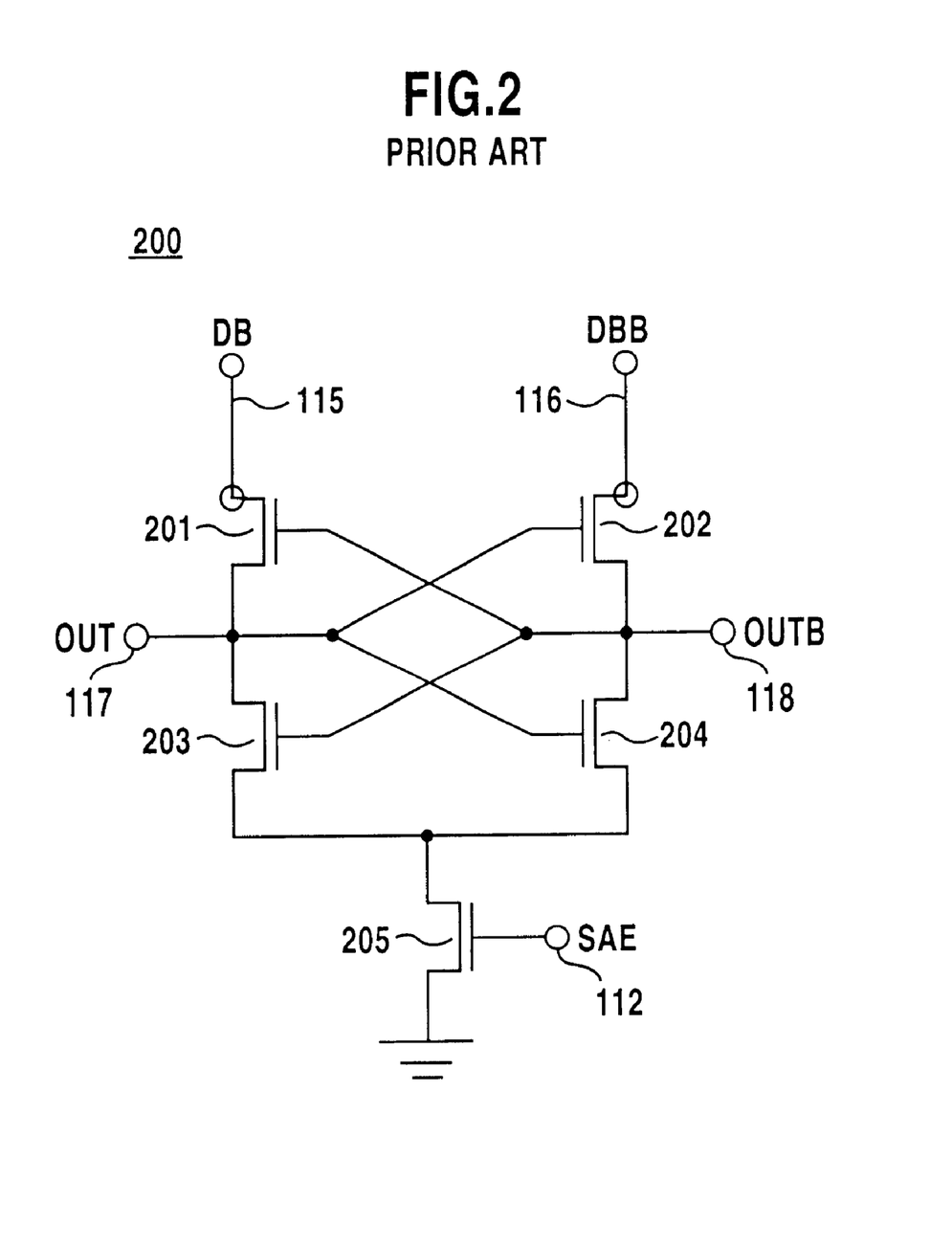
FIG. 2 shows an example of the sense amplifier 107 as shown in FIG. 1 for one data bit constructed by a conventional sense amplifier.

FIG. 2 shows an example of the sense amplifier 107 for one data bit constructed by a conventional sense amplifier. The sense amplifier 200 as shown in FIG. 2 is of a current detection type for a high speed operation. For example, this kind of sense amplifier is described in Japanese patent number 2551346. The sense amplifier 200 has P-channel metal oxide field effect transistors (as referred to PMOS, hereinafter) 201 and 202 and N-channel metal oxide field effect transistors (as referred to NMOS, hereinafter) 203, 204 and 205. A drain of the PMOS 201 is connected to a drain of the NMOS 203. A drain of the PMOS 202 is connected to a drain of the NMOS 204. A source of the NMOS 203, a source of the NMOS 204 and a drain of the NMOS 205 are connected each other. A source of the NMOS 205 is connected to a ground and the sense amplifier enable signal 112 is supplied to a gate of the NMOS 205. A gate of the PMOS 201, a gate of the NMOS 203 and the drain of the PMOS 202 are connected each other. A gate of the PMOS 202, a gate of the NMOS 204 and the drain of the PMOS 201 are also connected each other. A source of the PMOS 201 and a source of the PMOS 202 are two input terminals of the sense amplifier 200. The source of the PMOS 201 is connected to the data bus 115 in FIG. 1 and the source of the PMOS 202 is connected to the inverted data bus 116 in FIG. 1. An output terminal 117 and an inverted output terminal 118 are two output terminals of the sense amplifier 200.

The sense amplifier 200 quickly amplifies a current difference value supplied to the source of the PMOS 201 and the source of the PMOS 202 by means of a positive feedback, then outputs the logical value stored in the memory cell through the column switch 106 as shown in FIG. 1.

Figure 3:
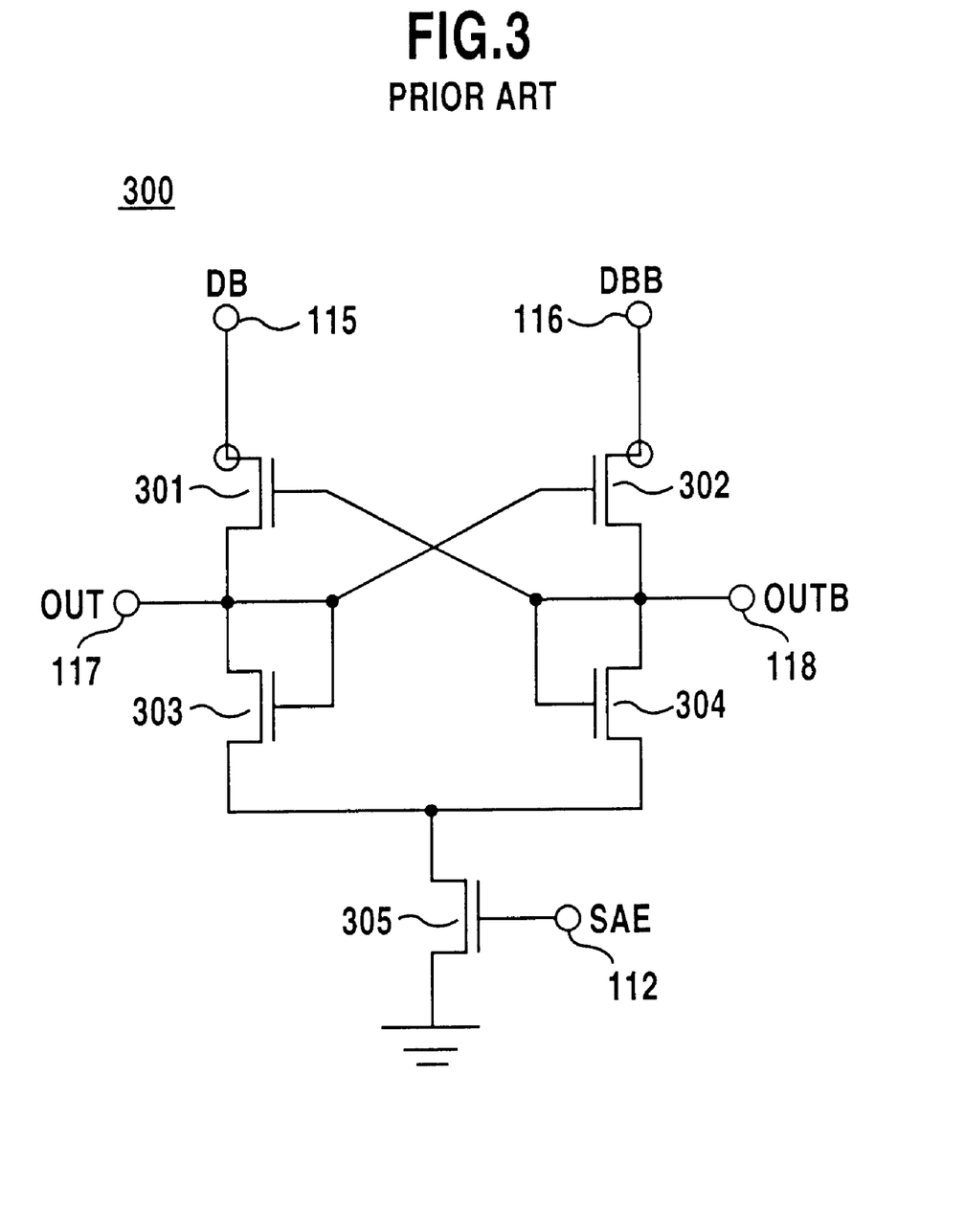
FIG. 3 shows another example of the sense amplifier 107 as shown in FIG. 1 for one data bit constructed by another conventional sense amplifier.

FIG. 3 shows another example of the sense amplifier 107 for one data bit constructed by another conventional sense amplifier. The sense amplifier 300 as shown in FIG. 3 is of a current detection type for a stable operation against noise. For example, this kind of sense amplifier is described in Laid-open Japanese patent application number 2-230694.

The sense amplifier 300 has a PMOS 301 and a PMOS 302, and an NMOS 301, an NMOS 304 and an NMOS 305. A drain of the PMOS 301 is connected to a drain of the NMOS 303. A drain of the PMOS 302 is connected to a drain of the NMOS 304. A source of the NMOS 303, a source of the NMOS 304 and a drain of the NMOS 305 are connected each other. A source of the NMOS 305 is connected to a ground and the sense amplifier enable signal 112 is supplied to a gate of the NMOS 305. A gate of the PMOS 301, a gate of the NMOS 304 and the drain of the NMOS 304 are connected each other. A gate of the PMOS 302, a gate of the NMOS 303 and the drain of the NMOS 303 are also connected each other. A source of the PMOS 301 and a source of the PMOS 302 are two input terminals of the sense amplifier 300. The source of the PMOS 301 is connected to the data bus 115 in FIG. 1 and the source of the PMOS 302 is connected to the inverted data bus 116 in FIG. 1. An output terminal 117 and an inverted output terminal 118 are two output terminals of the sense amplifier 300.

The sense amplifier 300 quickly amplifies a current difference value supplied to the source of the PMOS 301 and the source of the PMOS 302 by means of a positive feedback circuit constructed by the PMOS 301 and the PMOS 302, and outputs the logical value stored in the memory cell through the column switch 106 as shown in FIG. 1. In this sense amplifier 300, a negative feed circuit constructed by the NMOS 303 and the NMOS 304 prevents inappropriate operation caused by noise applied from outside the SRAM 100.

However, the sense amplifier 200 described above quickly amplifies the noise applied to the data bus 115 and the inverted data bus 116 while the logical value from the memory cell is being amplified because of its high speed operation. If the noise has an opposite polarity from the logical value to be amplified, then the output of the sense amplifier may be inverted against the correct logical value stored in the memory cell.

On the other hand, the sense amplifier 300 as shown in FIG. 3 is robust against the noise, however, the speed of the operation to detects the logical value stored in the memory cell is low.

SUMMARY OF THE INVENTION

It is a general object of the present invention to provide a semiconductor memory device, in which the above disadvantages are eliminated.

A more specific object of the present invention is to provide a semiconductor memory device, which has a sense amplifier that is stable against noise, has a large output amplitude, can operate with high speed and has low power.

The above objects of the present invention are achieved by a semiconductor memory device which comprises a memory cell array having a plurality of memory cells, complementary data bus lines connected to said memory cells in said memory cell array and a sense amplifier. The sense amplifier is connected to the memory cells through the complementary data bus lines and amplifies a difference between current values on said complementary data bus lines associated with a logical value stored in the memory cell. The sense amplifier has a positive feedback circuit having a plurality of differential pairs constructed by transistors.

According to the invention, it is possible to construct a sense amplifier which has a plurality of source inputs, so that sources of the transistors of one differential pair can be connected to the complementary data bus lines and sources of the transistors of other differential pairs can be connected to a voltage source. Therefore, the output level of the sense amplifier can reach the source voltage level by means of the transistors connected to the voltage source. As a result, the semiconductor memory device having the high speed sense amplifier with a large noise margin can be achieved.

BRIEF DESCRIPTION OF THE DRAWINGS

Other objects, features and advantages of the present invention will become more apparent from the following detailed description when read in conjunction with the accompanying drawings, in which.

DESCRIPTION OF THE PREFERRED EMBODIMENTS

Next, an embodiment according to the present invention will be explained.

A first embodiment according to the present invention will be explained.

Figure 4:
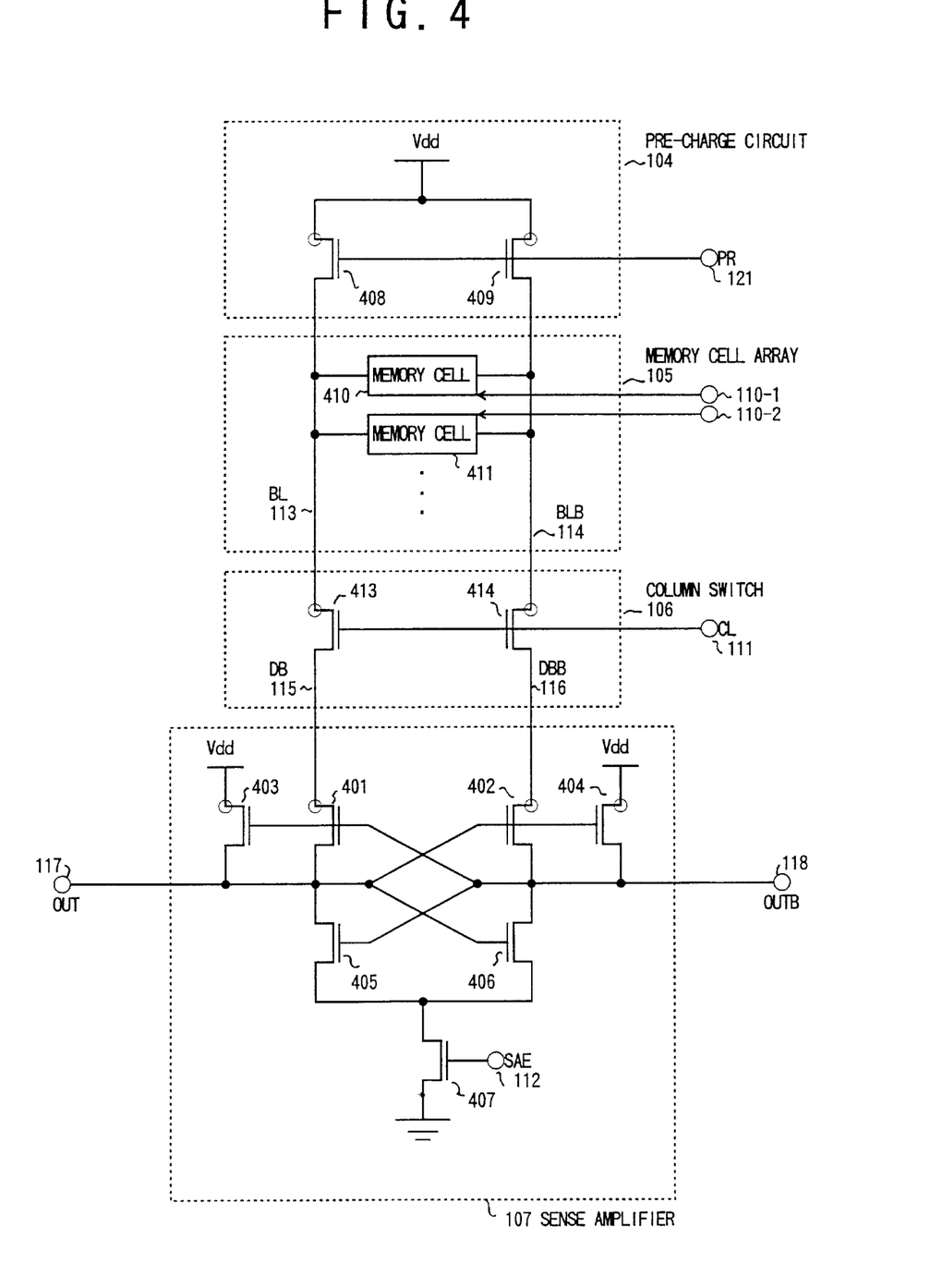
FIG. 4 shows a first embodiment of the sense amplifier according to the present invention.

FIG. 4 shows the first embodiment according to the present invention. Each of components having the same reference numeral shows the same component. FIG. 4 shows the area surrounded by a broken line 130 of a part for one column in the SRAM 100 as shown in FIG. 1. The part corresponding to one column mainly has the pre-charge circuit 104, the memory cell array 105, the column switch 106 and the sense amplifier 107. The sense amplifier 107 has PMOS transistors 401, 402, 403 and 404, and NMOS transistors 405, 406 and 407. The column switch 106 has PMOS transistors 413 and 414. The memory cell array 105 has a plurality of the memory cells 410, 411 and so on. The pre-charge circuit 104 has PMOS transistors 408 and 409.

Sources of the PMOS 408 and the PMOS 409 in the pre-charge circuit 104 are connected to a voltage source Vdd and gates of the PMOS 408 and the PMOS 409 are connected to the pre-charge signal 121. A drain of the PMOS 408 is connected to the bit line 113 and a drain of the PMOS 409 is connected to the inverted bit line 114. The terminal of the memory cell 410 is connected to the bit line 113 and another terminal of the memory cell 410 is connected to the inverted bit line 114. Two terminals of the memory cell 411 are also connected to the bit line 113 and the inverted bit line 114. An input terminal of the memory cell 410 is connected the word line driver 103 through the word selection line 110-1 to select the memory cell 410. An input terminal of the memory cell 411 is connected the word line driver 103 through the word selection line 110-2. The column switch 106 has PMOS transistors 413 and 414. A source of the PMOS 413 is connected to the bit line 113 and a source of the PMOS 414 is connected to the inverted bit lie 114.

The PMOS 401 and the PMOS 402 construct a first differential pair and the PMOS 403 and the PMOS 404 construct a second differential pair in the sense amplifier 107. It is possible to construct the second differential pair with transistors which have a different ratio W/L of a gate width W and a gate length L or a different shape of a gate oxide film from that of the first differential pair. It is also possible to connect a back gate of transistors in the first differential pair and the second differential pair to a predetermined bias level or to remains a back gate open. A source of the PMOS 401 is connected to the data bus 115 and a source of the PMOS 402 is connected to the inverted data bus 116. A gate of the PMOS 402 is connected to a drain of the PMOS 401, and a gate of the PMOS 401 is connected to a drain of the PMOS 402. A source of the PMOS 403 and a source of the PMOS 404 are connected to the voltage source Vdd. A gate of the PMOS 403 is connected to a gate of the PMOS 401 and a gate of the PMOS 404 is connected to a gate of the PMOS 402. A drain of the PMOS 403 is connected to a drain of the PMOS 401, and a drain of the PMOS 404 is connected to a drain of the PMOS 402.

A gate of the NMOS 405 is connected to the drain of the PMOS 402 and the gate of the PMOS 401, and a drain of the NMOS 405 is connected to the drain of the PMOS 401. A gate of the NMOS 406 is connected to the drain of the PMOS 401 and the gate of the PMOS 402, and a drain of the NMOS 406 is connected to the drain of the PMOS 402. A source of the NMOS 407 is connected to the ground and a drain of the NMOS 407 is connected to sources of the NMOS 405 and the NMOS 406. A gate of the NMOS 407 is connected to sense amplifier enable signal 112.

Next, a read operation to read data from the memory cell 411 will be explained. First, a LOW level signal is applied to the column selection line 111 to select the bit line 113 and the inverted bit line 114. Next, a LOW level signal is applied to the pre-charge line 121 so that the PMOS 408 and the PMOS 409 become a conduction state. As a result, The bit line 113, the inverted bit line 114, the data bus line 115 and the inverted data bus line 116 are pre-charged to the source voltage Vdd. Next, the PMOS 408 and the PMOS 409 are broken by applying a HIGH level signal to the pre-charge line 121. Then, the word line 110-2 is activated so that the memory cell 411 is activated. Either the bit line 113 or the inverted bit line 114 is discharged by the data (1 or 0) stored in the memory cell. As a result, a small potential difference is created between the bit line 113 and the inverted bit line 114. This potential difference is supplied to the data line 115 and the inverted data line 116 through the PMOS 413 and the PMOS 414 in the column switch 106.

Next, a HIGH level signal is applied to the sense amplifier selection signal 112 so that the NMOS 407 becomes a conduction state. As a result, the sense amplifier is activated. First, the source potential of both the NMOS 405 and the NMOS 406 become 0 V and the NMOS 405 and the N406 become a conduction state. As a result, the potential of both the gates of the PMOS 401 and the PMOS 403 and the potential of both the gates of the PMOS 402 and the PMOS 404 are decreased. Then, the PMOS 401, 402, 403 and 404 become a conduction state and start to operate in a saturation region. A current through the PMOS 401 is slightly different from a current through the PMOS 402 because there is a small potential difference $\Delta V$ between the source potential of the PMOS 401 and the source potential of the PMOS 402. Therefore, a small potential difference is created between a potential of the output 117 and a potential of the inverted output 118. This small potential difference between the output 117 and the inverted output 118 is quickly amplified by the positive feedback operation of the PMOS 401, 402, 403 and 404 and the NMOS 405 and 406. On the other hand, the potential of the data bus line 115 and the potential of the inverted data bus line 116 are gradually decreasing by the current through the sense amplifier 107 because the pre-charge signal 121 is HIGH during sensing operation.

However, the sensing operation described above continues until the potential of the output 117 and the potential of the inverted output 118 become the voltage Vdd or 0 V because the sources of the PMOS 403 and the PMOS 404 are connected to the voltage Vdd.

Figure 5:
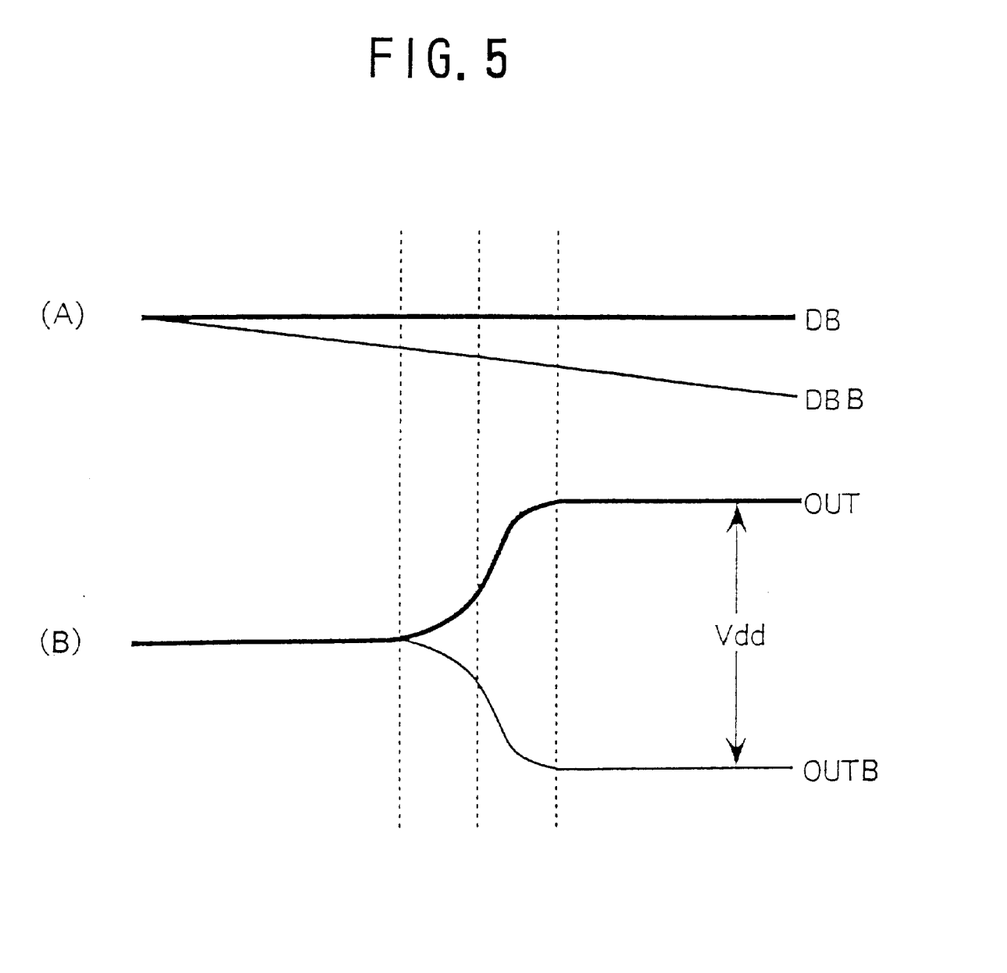
FIG. 5 shows waveforms of the sense amplifier of the first embodiment according to the present invention.

FIG. 5 shows waveforms of the sense amplifier of the first embodiment according to the present invention. FIG. 5(A) shows the voltage variation on the data bus line (DB) 115 and the inverted data bus line (DBB) 116, and FIG. 5(B) shows the voltage variation for the output (OUT) 117 and the inverted output (OUTB) 118. As shown in FIG. 5(B), the potential difference between the output (OUT) 117 and the inverted output (OUTB) 118 is finally equal to the voltage Vdd.

Figure 6:
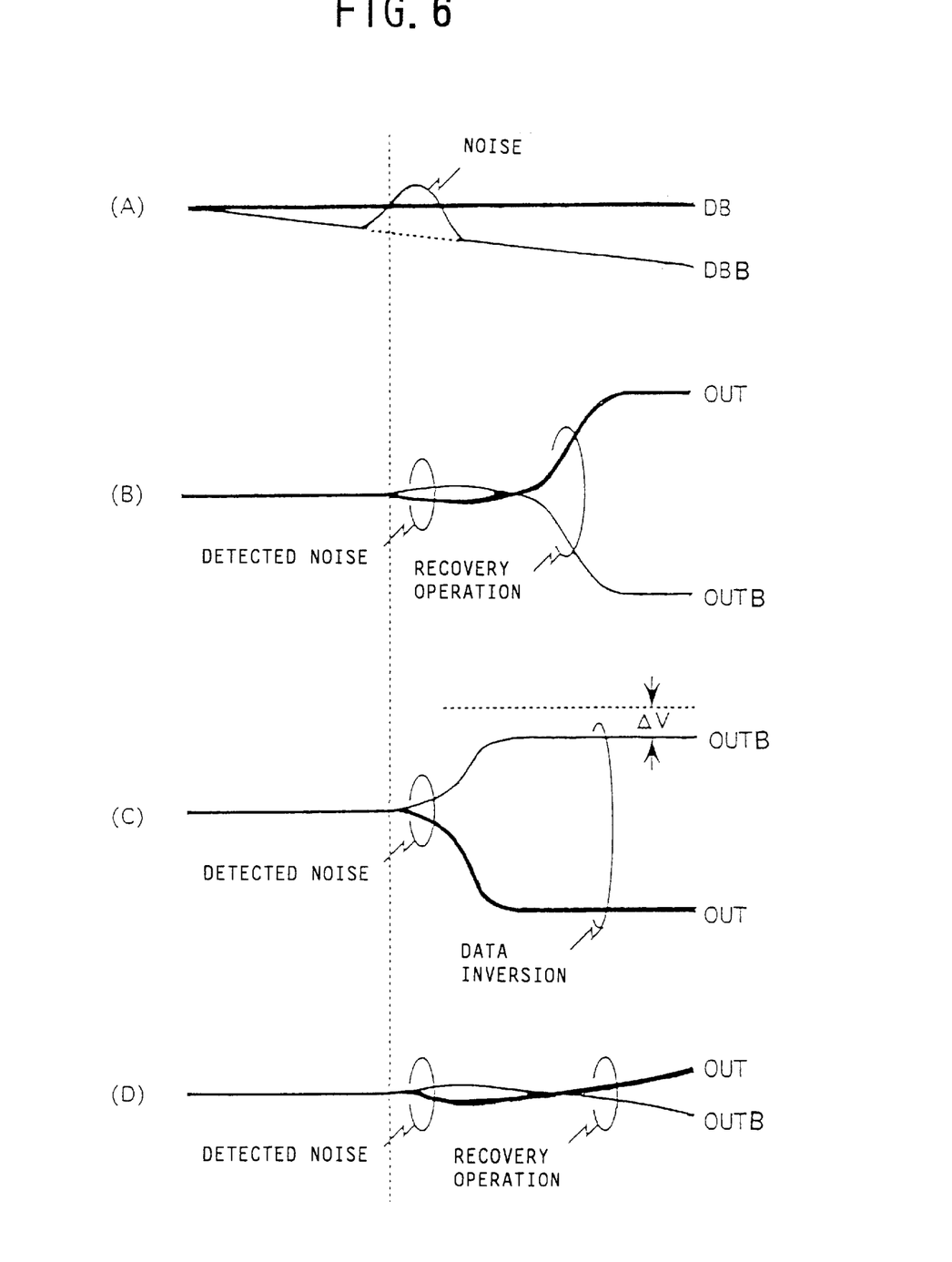
FIG. 6 shows waveforms of the sense amplifier of the first embodiment according to the present invention when the noise is supplied to the data buses.

On the other hand, FIG. 6 shows waveforms of the sense amplifier of the first embodiment according to the present invention when the noise is applied to the data buses after the activation of the sense amplifier is started. FIG. 6(A) shows a case where the noise is applied to the inverted data bus DBB. The potential of the inverted data bus DBB crosses the potential of the data bus DB because of the noise. FIG. 6(B) shows the output waveform of the sense amplifier of the first embodiment of the present invention in this case. FIG. 6(C) shows the output waveform of the conventional sense amplifier as shown in FIG. 2 in the same case. FIG. 6(D) shows the output waveform of the conventional sense amplifier as shown in FIG. 3 in the same case.

In FIG. 6(B), the sense amplifier starts to amplify the inverted data having an opposite polarity to the correct data when the sense amplifier is activated because the noise is detected by the PMOS 401 and the PMOS 402. However, in the present invention, for example, the ratio W/L of the gate width W and the gate length L of the PMOS 401 and the PMOS 402 are designed to be smaller than that of the PMOS 403 and the PMOS 404, so that a low sensitivity to the noise is achieved. Therefore, the noise is not amplified to a high level. Then, the differential pair constructed by the PMOS 403 and the PMOS 404 quickly amplifies the output (OUT) and the inverted output (OUTB) to the voltage Vdd and 0 V in a recovery state after the noise is disappeared, then the correct data is latched at the output of the sense amplifier.

On the other hand, as shown in FIG. 6(C), the conventional sense amplifier as shown in FIG. 2 quickly amplifies the inverted data having an opposite polarity to the correct data by the positive feed back operation of the differential pair of the PMOS 201 and the PMOS 202 and the differential pair of the NMOS 203 and the NMOS 204 when the noise is once applied to the data bus. As a result, the inverted data having the opposite polarity to the correct data is latched at the output (OUT) and the inverted output (OUTB) of the sense amplifier. Further, levels of the inverted output (OUTB) of the conventional sense amplifier as shown in FIG. 2 only reaches the voltage (Vdd-$\Delta V$) instead of the voltage Vdd in spite of quick amplification operation.

As shown in FIG. 6(D), the conventional sense amplifier as shown in FIG. 3 quickly amplifies the inverted data having an opposite polarity to the correct data by the positive feed back operation of the differential pair of the PMOS 301 and the PMOS 302 when the noise is once applied to the data bus. However, the differential pair of the NMOS 203 and the NMOS 204 suppresses the quick amplification operation by means of the negative feed-back operation. Therefore, the output (OUT) and the inverted output (OUTB) are correctly amplified in the recovery state after the noise is disappeared, and the correct data is latched at the output of the sense amplifier. However, the differential pair of the NMOS 203 and the NMOS 204 also suppresse the quick amplification operation by means of the negative feed back operation.

Figure 7:
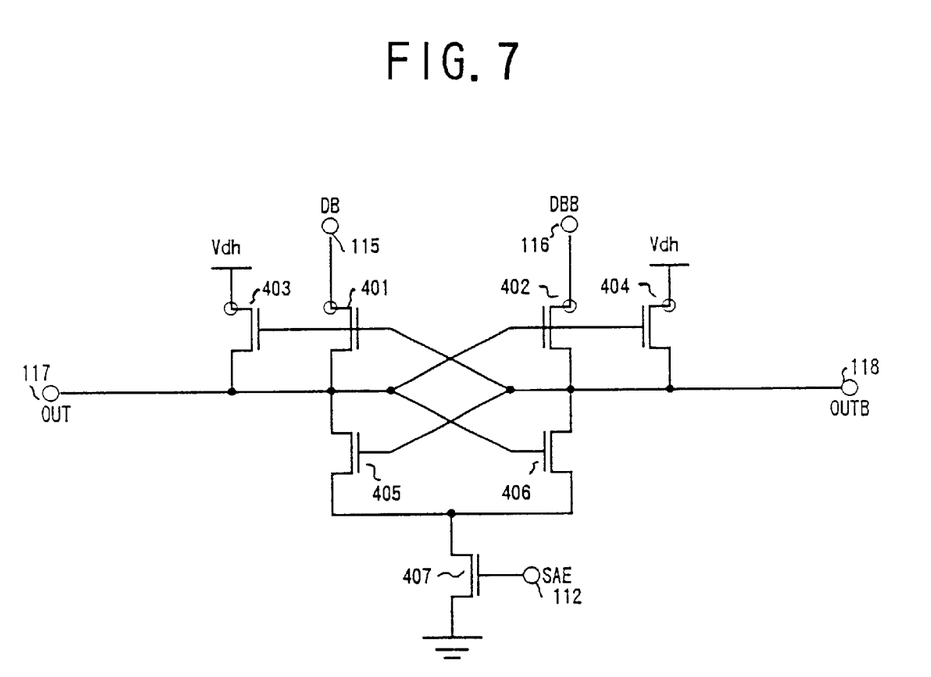
FIG. 7 shows a second embodiment of the sense amplifier according to the present invention.

Next, a second embodiment according to the present invention will be explained. FIG. 7 shows the second embodiment of the sense amplifier according to the present invention. A difference between the sense amplifier 107 as shown in FIG. 7 and the sense amplifier 107 as shown in FIG. 4 is that the sources of the PMOS 403 and the PMOS 404 are connected to the voltage Vdh in FIG. 7 which is different from the voltage Vdd. In this embodiment, the voltage source Vdh is used for the sense amplifier. The voltage source Vdh is independent of the voltage source Vdd which is used for, such as the pre-charge circuit 104 in the SRAM 100. This voltage Vdh may be supplied by a step-up voltage source which steps up the voltage Vdd to the voltage Vdh. As a result, it is possible to achieve the high-speed sense amplifier without increasing a power dissipation of the SRAM 100.

Figure 8:
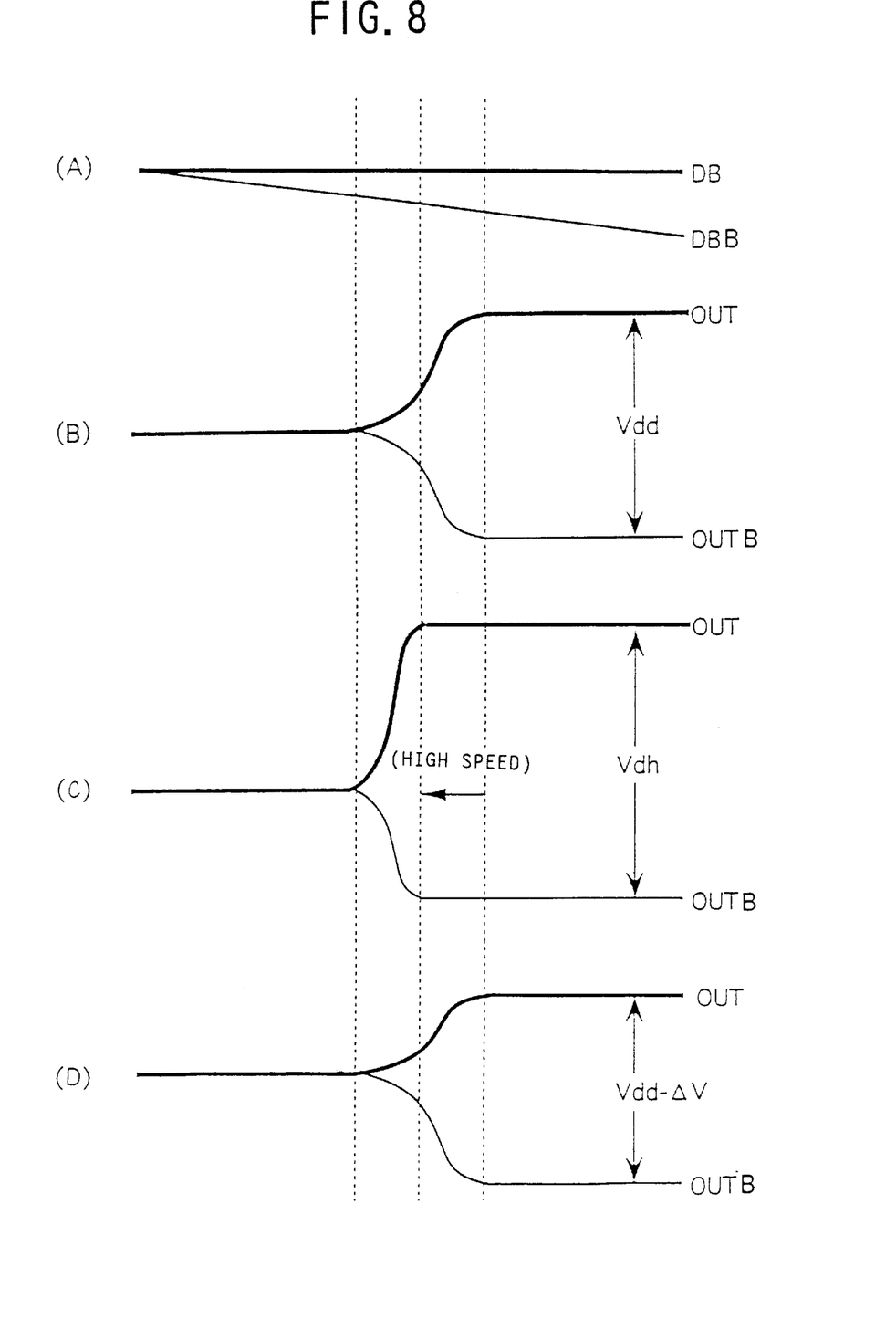
FIG. 8 shows waveforms of the sense amplifier of the second embodiment according to the present invention.

FIG. 8 shows waveforms of the sense amplifier of the second embodiment according to the present invention. FIG. 8(A) shows the voltage variation on the data bus: line (DB) 115 and the inverted data bus line (DBB) 116 and FIG. 8(B) shows the voltage variation for the output (OUT) 117 and the inverted output (OUTB) 118 in case that the voltage Vdd is used for the sense amplifier. FIG. 8(C) shows the voltage variation for the output (OUT) 117 and the inverted output (OUTB) 118 of the sense amplifier of this second embodiment in which the voltage Vdh is used for the sense amplifier, and FIG. 8(D) shows the voltage variation for the output (OUT) 117 and the inverted output (OUTB) 118 of the conventional sense amplifier. As shown in FIG. 8(C), the sense amplifier with the voltage Vdh of this embodiment of the present invention can operate with higher speed than that of the sense amplifier with the voltage Vdd if the voltage Vdh is higher than the voltage Vdd.

Figure 9:
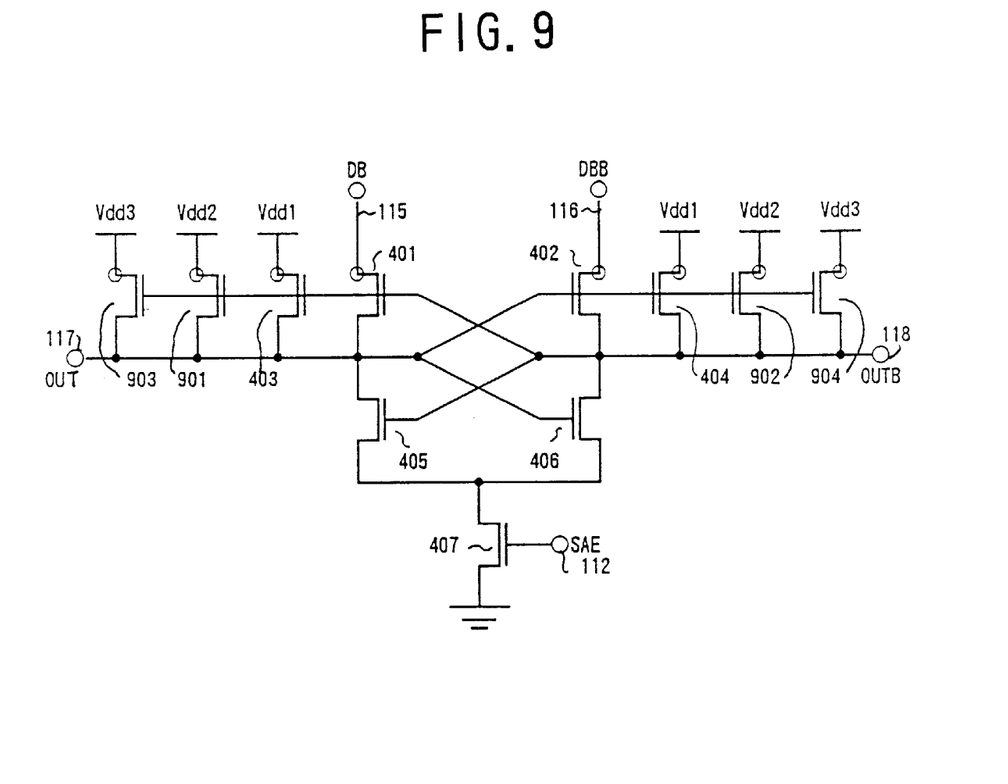
FIG. 9 shows a third embodiment of the sense amplifier according to the present invention.

Next, a third embodiment according to the present invention will be explained. FIG. 9 shows the third embodiment of the sense amplifier according to the present invention. A difference between the sense amplifier 107 as shown in FIG. 9 and the sense amplifier 107 as shown in FIG. 7 is that additional differential pairs each of which is constructed by two PMOS transistors are provided in the sense amplifier 107 as shown in FIG. 9. In this embodiment, a differential pair constructed by PMOS transistors 901 and 902 and another differential pair constructed by PMOS transistors 903 and 904 are provided. However, a number of the differential pairs is not limited to two and it is possible to provide any number of the differential pairs. In this embodiment, the sources of the PMOS 403 and the PMOS 404 are connected to the voltage Vdd1, the sources of the PMOS 901 and the PMOS 902 are connected to the voltage Vdd2, and the sources of the PMOS 903 and the PMOS 904 are connected to the voltage Vdd3. The voltage Vdd1, Vdd2 and Vdd3 are different from the voltage Vdd.

Figure 10:
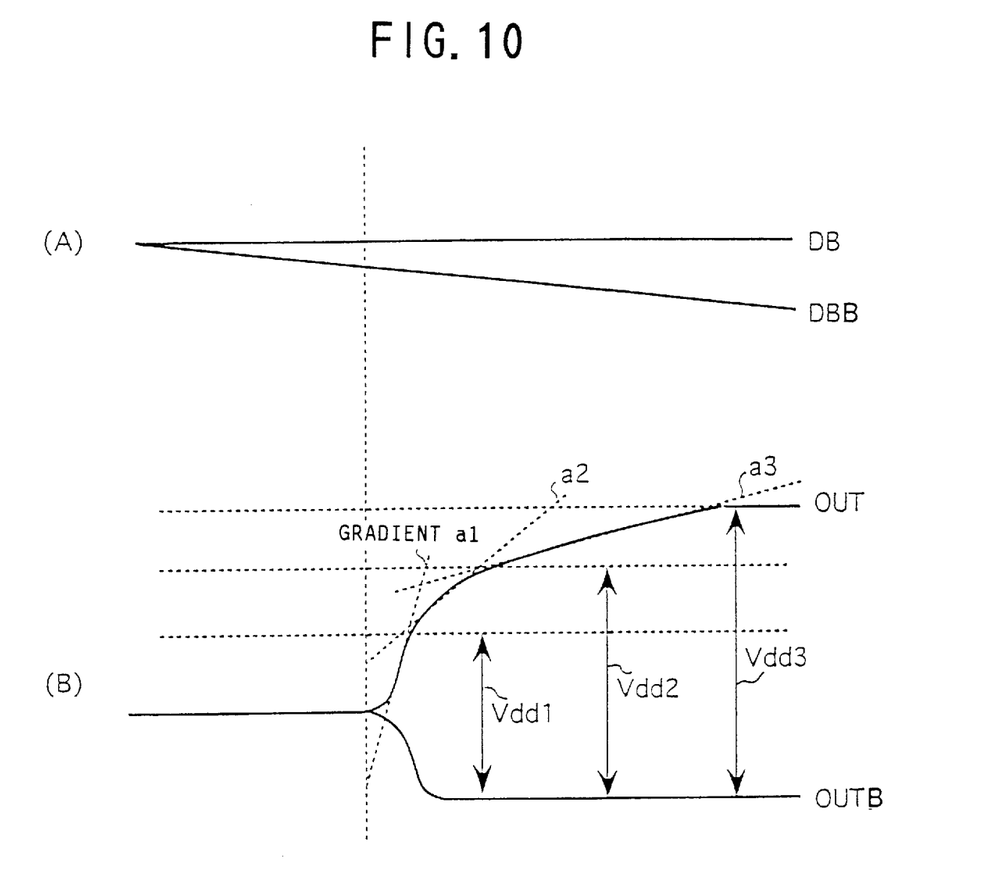
FIG. 10 shows waveforms of the sense amplifier of the third embodiment according to the present invention.

FIG. 10 shows waveforms of the sense amplifier of the third embodiment according to the present invention. FIG. 10(A) shows the voltage variation for the data bus line (DB) 115 and the inverted data bus line (DBB) 116 and FIG. 10(B) shows the voltage variation for the output (OUT) 117 and the inverted output (OUTB) 118. The voltage variation of the output (OUT) and the inverted output (OUTB) depend on the voltage Vdd1 which is supplied to the sources of the PMOS 403 and the PMOS 404, the voltage Vdd2 which is supplied to the sources of the PMOS 901 and the PMOS 902 and the voltage Vdd3 which is supplied to the sources of the PMOS 903 and the PMOS 904. FIG. 10(B) shows the voltage variation of the output (OUT) and the inverted output (OUTB) when relation between Vdd1, Vdd2 and Vdd3 satisfies Vdd1<Vdd2<Vdd3. A voltage gradient a1 depends on the voltage Vdd1, a voltage gradient a2 depends on the voltage Vdd2 and a voltage gradient a3 depends on the voltage Vdd3. Therefore, it is possible to adjust each of the voltage gradients a1, a2 and a3 of the output (OUT) and the inverted output (OUTB) by adjusting the voltage Vdd1, Vdd2 and Vdd3.

Figure 11:
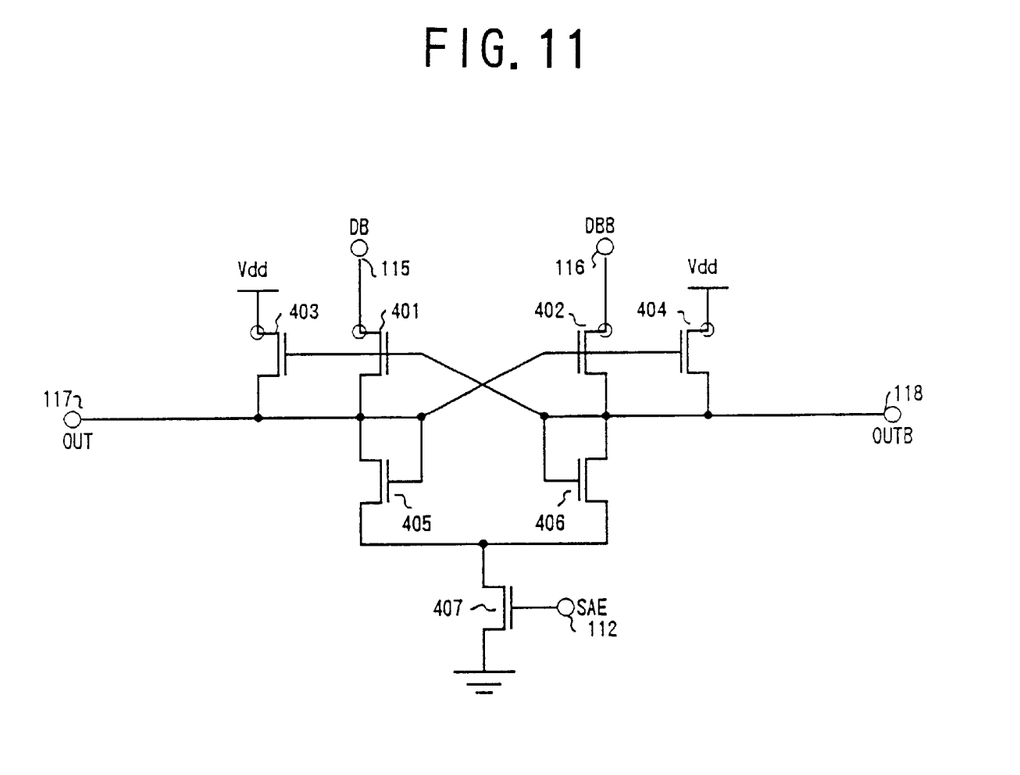
FIG. 11 shows a fourth embodiment of the sense amplifier according to the present invention.

Next, a fourth embodiment according to the present invention will be explained. FIG. 11 shows the fourth embodiment of the sense amplifier according to the present invention. A difference between the sense amplifier 107 as shown in FIG. 11 and the sense amplifier 107 as shown in FIG. 4 is that the differential pair constructed by the NMOS 405 and the NMOS 406 construct a negative feedback circuit in the sense amplifier 107 as shown in FIG. 11. In this embodiment, the voltage Vdd is supplied to the sources of the PMOS 403 and the PMOS 404. However, it is also possible to supply the sources of the PMOS 403 and the PMOS 404 with the voltage Vdd1 as supplied to the sense amplifier of the second embodiment as shown in FIG. 7.

Figure 12:
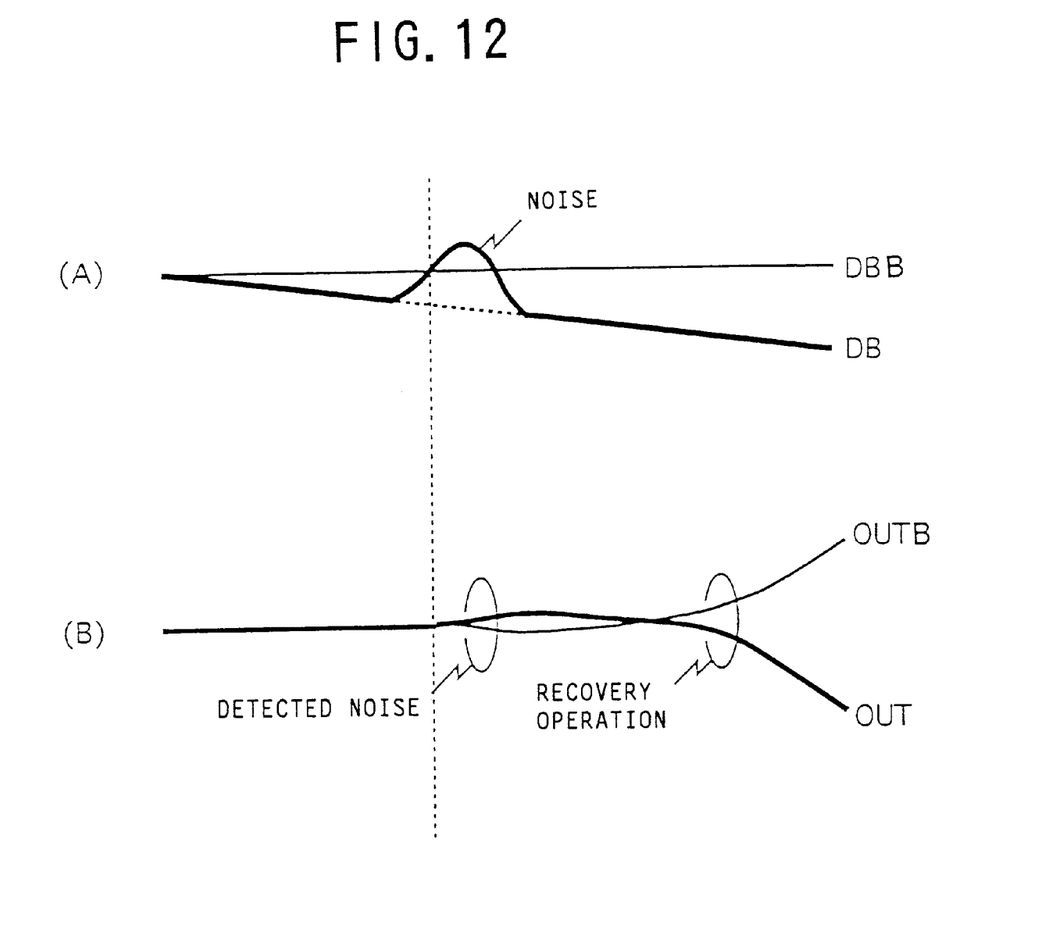
FIG. 12 shows waveforms of the sense amplifier of the fourth embodiment according to the present invention.

FIG. 12 shows waveforms of the sense amplifier of the fourth embodiment according to the present invention. FIG. 12(A) shows a case where the noise is supplied to the data bus DB. The potential of the data bus DB crosses the potential of the inverted data bus DBB because of the noise. FIG. 12(B) shows the output waveform of the sense amplifier of the fourth embodiment of the present invention in this case.

As shown in FIG. 12(B), the sense amplifier as shown in FIG. 11 quickly amplifies the noise by the positive feed back operation of the differential pair of the PMOS 401, 402, 403 and 404 when the noise is once applied to the data bus DB. However, the differential pair of the NMOS 405 and the NMOS 406 suppresses the quick amplification operation by means of the negative feed back operation. Therefore, the output (OUT) and the inverted output (OUTB) are correctly amplified in the recovery state after the noise is disappeared, then the correct data is latched at the output of the sense amplifier.

As described above, it is possible to provide a semiconductor memory device, which has a sense amplifier that is stable against noise, has a large output amplitude, can operate with high speed and has low power.

The present invention is not limited to the specifically disclosed embodiments, and variations and modifications may be made without departing from the scope of the present invention.

The present application is based on Japanese priority application No. 11-338712 filed on Nov. 27, 1999, the entire contents of which are hereby incorporated by reference.

What is claimed is:

1. A semiconductor memory device comprising:
a memory cell array having a plurality of memory cells;
complementary data bus lines connected to said memory cells in said memory cell array; and
a sense amplifier connected to said memory cells through said complementary data bus lines and amplifying a difference between current values on said complementary data bus lines associated with a logical value stored in said memory cell, wherein said sense amplifier comprises a positive feedback circuit having a plurality of difference pairs constructed by transistors, a gate of a transistor of one difference pair is connected commonly to a gate of a transistor of another difference pair;
wherein each of said plurality of difference pairs is configured so that a low sensitivity to noise is achieved.

2. The semiconductor memory device as claimed in claim 1, said transistors are P-channel field effect transistors.

3. The semiconductor memory device as claimed in claim 1, wherein sources of said transistors of said one difference pair are connected to said complementary data bus lines, and sources of said transistors of said another difference pair are connected to a voltage source.

4. The semiconductor memory device as claimed in claim 3, said transistors are P-channel field effect transistors.

5. The semiconductor memory device as claimed in claim 1, wherein sources of said transistors of said one difference pair are connected to said complementary data bus lines, and sources of said transistors of said another difference pair are connected to a voltage source other than a voltage source which pre-charges said complementary data bus lines.

6. The semiconductor memory device as claimed in claim 5, said transistors are P-channel field effect transistors.

7. The semiconductor memory device as claimed in claim 1, wherein sources of said transistors of said one difference pair of said plurality of differential pairs are connected to said complementary data bus lines, and sources of said transistors of each difference pair other than said one difference are connected to separate voltage sources.

8. The semiconductor memory device as claimed in claim 7, said transistors are P-channel field effect transistors.

9. A semiconductor memory device comprising:

a memory cell array having a plurality of memory cells;

complementary data bus lines connected to said memory cells in said memory cell array; and a sense amplifier connected to said memory cells through said complementary data bus lines and amplifying a difference between current values on said complementary data bus lines associated with a logical value stored in said memory cell, wherein said sense amplifier comprising a positive feedback circuit having a plurality of differential pairs constructed by P-channel field effect transistors, said positive feedback circuit comprising:

a first P-channel field effect transistor constructing a first differential pair, a source of said first P-channel field effect transistor is connected to one data line of said complementary data bus lines;

a second P-channel field effect transistor constructing a first differential pair, a source of which is connected to another data line of said complementary data bus lines, a gate of which is connected to a drain of said first P-channel field effect transistor constructing said first differential pair, and a drain of which is connected to a gate of said first P-channel field effect transistor constructing said first differential pair;

a first P-channel field effect transistor constructing a second differential pair, a source of which is connected to a first voltage source, a gate of which is connected to said gate of said first P-channel field effect transistor constructing said first differential pair, and a drain of which is connected to said drain of said first P-channel field effect transistor constructing said first differential pair;

a second P-channel field effect transistor constructing a second differential pair, a source of which is connected to said first voltage source, a gate of which is connected to said gate of said second P-channel field effect transistor constructing said first differential pair, and a drain of which is connected to said drain of said second P-channel field effect transistor constructing said first differential pair.

10. The semiconductor memory device as claimed in claim 9, said positive feedback circuit further comprising:

a first N-channel field effect transistor, a gate of which is connected to both said drain of said second P-channel field effect transistor constructing said first differential pair and said gate of said first P-channel field effect transistor constructing said first differential pair, and a drain of which is connected to said drain of said first P-channel field effect transistor constructing said first differential pair;

a second N-channel field effect transistor, a gate of which is connected to both said drain of said first P-channel field effect transistor constructing said first differential pair and said gate of said second P-channel field effect transistor constructing said first differential pair, and a drain of which is connected to said drain of said second P-channel field effect transistor constructing said first differential pair;

a third N-channel field effect transistor, a source of which is connected to a ground, a gate of which is connected to a sense amplifier enable signal to control said sense amplifier, and a drain of which is connected to both a source of said first N-channel field effect transistor and a source of said second N-channel field effect transistor.

11. The semiconductor memory device as claimed in claim 9, said positive feedback circuit further comprising:

a first N-channel field effect transistor, a gate of which is connected to both said gate of said second P-channel field effect transistor constructing said first differential pair and said drain of said first P-channel field effect transistor constructing said first differential pair, and a drain of which is connected to said drain of said first P-channel field effect transistor constructing said first differential pair;

a second N-channel field effect transistor, a gate of which is connected to both said gate of said first P-channel field effect transistor constructing said first differential pair and said drain of said second P-channel field effect transistor constructing said first differential pair, and a drain of which is connected to said drain of said second P-channel field effect transistor constructing said first differential pair;

a third N-channel field effect transistor, a source of which is connected to the ground, a gate of which is connected to a sense amplifier enable signal to control said sense amplifier, and a drain of which is connected to both a source of said first N-channel field effect transistor and a source of said second N-channel field effect transistor.

12. A semiconductor memory device comprising:

a memory cell array having a plurality of memory cells;

complementary data bus lines connected to said memory cells in said memory cell array; and a sense amplifier connected to said memory cells through said complementary data bus lines and amplifying a difference between current values on said complementary data bus lines associated with a logical value stored in said memory cell, wherein said sense amplifier comprises a positive feedback circuit having a plurality of difference pairs constructed by PMOS transistors, a gate of a transistor of one difference pair is connected commonly to a gate of a transistor of another difference pair.

13. A semiconductor memory device comprising:

a memory cell array having a plurality of memory cells;

complementary data bus lines connected to said memory cells in said memory cell array; and a sense amplifier connected to said memory cells through said complementary data bus lines and amplifying a difference between current values on said complementary data bus lines associated with a logical value stored in said memory cell, wherein said sense amplifier comprises a positive feedback circuit having at least four transistors, gates of one half of said transistors are connected to a first output of said sense amplifier, drains of said one half of said transistors are connected to a second output of said sense amplifier, sources of said one half of said transistors are connected to said complementary data bus line or a voltage source, gates of another half of said transistors are connected to said second output of said sense amplifier, drains of said another half of said transistors are connected to said first output of said sense amplifier, and sources of said another half of said transistors are connected to said complementary data bus line or said voltage source.

* * * * *